United States Patent [19]
Miyamoto et al.

[11] 4,073,968
[45] Feb. 14, 1978

[54] METHOD FOR DESENSITIZATION OF A COLOR DEVELOPER

[75] Inventors: Akio Miyamoto; Hiroharu Matsukawa; Teruo Kobayashi, all of Fujimiya, Japan

[73] Assignee: Fuji Photo Film Co., Ltd., Minami-ashigara, Japan

[21] Appl. No.: 736,048

[22] Filed: Oct. 27, 1976

[30] Foreign Application Priority Data

Oct. 27, 1975 Japan ............... 50-129098
Nov. 12, 1975 Japan ............... 50-136033
Nov. 18, 1975 Japan ............... 50-138419

[51] Int. Cl.$^2$ .................... B41M 3/12; B41M 5/12
[52] U.S. Cl. ................... 427/54; 282/27.5; 427/146; 427/150; 427/151
[58] Field of Search ............ 96/35.1; 427/43, 54, 427/150, 151, 259, 272, 282, 146, 369; 428/207, 446, 447, 913, 914, 195; 282/27.5

[56] References Cited

U.S. PATENT DOCUMENTS 3,952,117  4/1976  Miyamoto ............... 427/150
4,007,310  2/1977  Miyamoto et al. ........ 427/150 X Primary Examiner—Michael R. Lusignan
Attorney, Agent, or Firm—Sughrue, Rothwell, Mion, Zinn and Macpeak

[57] ABSTRACT

A method of desensitization of a color developer to form a color upon reaction with a color former which comprises coating a photocurable composition containing a photocurable compound on a color developer sheet and then irradiating the coated surface with light to cure the photocurable compound and thereby desensitize the color developer surface.

11 Claims, No Drawings

METHOD FOR DESENSITIZATION OF A COLOR DEVELOPER

BACKGROUND OF THE INVENTION

1. Field of the Invention

This invention relates to a process for desensitization, and more specifically, to a process for desensitization in which the function of a color developer which causes a colorless color former compound to form a color is reduced or destroyed.

2. Description of the Prior Art

It has long been known to obtain a colored image by a reaction caused upon contact between an electron-donating or proton-receptive colorless organic compound (to be referred to hereinafter as a "color former") and an electron-receptive or proton-releasing solid acid (to be referred to hereinafter as a "color developer").

This phenomenon is utilized, for example, in pressure-sensitive copying sheets (for example, as disclosed in U.S. Pat. Nos. 2,505,470, 2,505,489, 2,550,471, 2,548,366, 2,712,507, 2,730,456, 2,730,457, 3,418,250, and 3,672,935), and pressure-sensitive recording sheets (for example, Japanese Patent Publication Nos. 4160/68, 7600/68 and 14039/70, and U.S. Pat. No. 2,939,009).

A printing process is also known in which an ink containing a color former is fed to a sheet coated with a color developer to obtain a colored image (see German Pat. No. 1,939,962). The color developer is as defined hereinabove, and includes, for example, clays, phenolic resins, and metal salts of aromatic carboxylic acids.

Since these color developers are generally coated uniformly on the entire surface of a support, a composition containing a desensitizer is coated using a printing press or the like on those areas of the color developer sheet which are not to be used for recording so as to desensitize those areas.

Known desensitizing agents include, for example, organic amines or quaternary salts thereof (see U.S. Pat. No. 2,777,780), and tertiary amines resulting from the chemical bonding of ethylene oxide to monoalkylamines, aralkylamines, or ethanolamine (see Japanese Patent Publication No. 35697/71), spiroacetal-type diamines and reaction products between spiroacetal-type diamines and compounds containing an oxirane group (German Patent Application (OLS) 2,343,800), and polyhydric alcohols such as polyethylene glycol or polypropylene glycol.

These desensitizing agents are all basic compounds, and react chemically with an acidic color developer to destroy or reduce the color developing activity of the color developer. However, when these desensitizing agents are used a slow drying of the printed surface occurs, and therefore, it is impossible to increase the speed of printing. When the surface coated with the desensitizer is written on or printed with a colored ink, the printed image of the colored ink markedly changes or fades, or becomes blurred.

Furthermore, when in a pressure-sensitive copying sheet a microcapsule layer containing a color former and a color developer sheet coated with a desensitizer are allowed to stand in contact with each other, the desensitizer causes the microcapsule wall to swell, and sometimes the wall membrane is destroyed. This may lead to the occurrence of fog.

SUMMARY OF THE INVENTION

A primary object of this invention is to provide a process for desensitization in which the desensitized surface after coating can be rapidly dried, and an increased coating rate can be achieved.

Another object of this invention is to provide a process for desensitization in which when a desensitized surface is written on or printed with a colored ink, the colored ink image does not change or fade nor blur.

A further object of this invention is to provide a process for desensitization in which even when a microcapsule layer and a color developer subjected to desensitization are allowed to stand in contact with each other, the microcapsule wall is not swollen, and therefore, fog does not occur.

Various investigations have been conducted which ultimately led to the development of a new desensitization process which is quite different in concept from conventional chemical desensitizing methods.

The method of this invention comprises coating a photocurable composition on a surface coated with a color developer, and then irradiating the coated surface with light to cover the color developer with a cured film thereby to desensitize the color developer. That part of the color developer which is thus coated with the cured film is no longer capable of inducing a color forming reaction even when it comes into contact with a color former. In other words, the principle of this method is to separate the color developer from the color former by the photocured film.

DETAILED DESCRIPTION OF THE INVENTION

According to the process of this invention, drying at the time of desensitization coating or printing can be performed instantaneously, and even when the resulting desensitized surface is written on or printed with a colored ink, the image formed does not blur nor does a change or fading in color occur.

Furthermore, the process of the invention does not at all affect the microcapsule wall which envelops the color former, and there is no occurrence of fog. The photocurable composition, as used in the present invention, comprises a photocurable compound and, if desired, additives.

The photocurable compound is a compound which is cured upon irradiation with light, especially light in the ultraviolet region. For example, the photocurable compound can be classified into photocrosslinking-type compounds and photopolymerizing-type compounds.

Photocrosslinkable compounds are compounds containing an internal double bond, and include compounds of the cinnamic acid type, chalcone acid type, stilbazole type and rubber type.

A photocrosslinkable compound of the cinnamic acid type can be described as a compound having the following moiety in the main chain or a branched chain thereof:

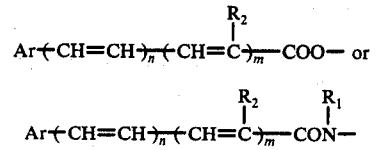

wherein Ar represents an aromatic nucleus which may be a heterocyclic ring or a condensed ring; $R_1$ represents a hydrogen atom, an alkyl group or an aryl group; $R_2$ represents a hydrogen atom, an alkyl group, an aryl group, a cyano group, a carbamoyl group, a carboxy group or an alkoxycarbonyl group; $m$ is 0 or 1 and $n$ is 1 to 4.

A chalcone type compound contains therein the following moiety:

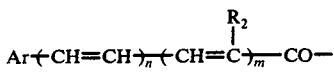

wherein Ar, $R_2$, $m$ and $n$ have the same meaning as defined above.

A stilbazole type compound contains the following moiety therein:

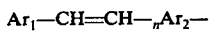

wherein $Ar_1$ and $Ar_2$ each represents an aromatic nucleus as described above and $n$ represents 1 to 4.

Rubber type compounds generally contain the following moiety therein:

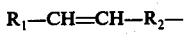

wherein $R_1$ and $R_2$ each represents an alkyl group.

Photopolymerizable compounds are compounds containing preferably several vinyl or vinylidene linkages and containing a group such as an acrylic, acryloyl, acrylamide, allyl, unsaturated polyester vinyl ester, vinyl ether or vinyl thioether group.

Photopolymerizable compounds are compounds having therein at least one of the following moieties:

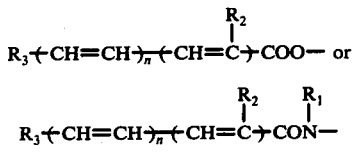

wherein $R_3$ represents a hydrogen atom, an alkyl group or an aralkyl group and $R_1$, $R_2$, $m$ and $n$ have the same meaning as defined above for the photocrosslinkable compounds.

These photocurable compounds are disclosed in detail in, for example, U.S. Pat. Nos. 2,835,656, 3,357,831, 3,737,319, 3,418,295, 3,647,470, 3,409,593, 2,956,878, 3,173,783, 3,023,100, 3,066,117, 3,803,109, 3,700,643, 3,794,576, 3,551,235, 3,661,614, 3,650,885, 3,719,638, and 3,799,915.

Specific examples of photocurable compounds are reaction products formed between cinnamic acid, cinnamylidenic acid, furanacrylic acid or furylpentadienic acid with compounds containing an amino, hydroxyl or oxirane group such as polyvinyl alcohol, polyhydroxyethyl methacrylate, polyvinylphenol, polyglycidyl methacrylate, polyepichlorohydrin or polyaminostyrene, condensation reaction products such as ester, amide, urethane group containing polymers formed between compounds containing a functional group such as a carboxyl, amino or hydroxyl group such as phenylenediacrylic acid, benzylidenemalonic acid, dihydroxychalcone or sodium diaminostilbenedisulfonic acid and diisocyanates, diols, dicarboxylic acids and dicarboxylic acid esters, such as 1,4-bishydroxyethyl-cyclohexane-p-phenylene diacrylate, polymethacryloxyethyl cinnamate, polyglycidyl methacrylate cinnamate or polyvinyloxyethylfuryl acrylate, reaction products formed between a maleic acid anhydride copolymer (such as a styrene-maleic acid copolymer, a methylvinylether-maleic acid copolymer), an epoxy resin with a chalcone containing a hydroxyl or amino group; acid reaction products formed between a compound containing two amino or two hydroxyl groups such as dihydroxychalcone or diaminochalcone with diisocyanates or diacid chlorides; reaction products formed between polymers containing an amino or hydroxyl group with a chalcone containing an acid halide group, for example, a reaction product of polyhydroxyethylmethacrylate with chalcone-4-carboxylic acid chloride; a reaction product of hydroxyethoxystilbazole with a styrene-maleic acid copolymer; a reaction product of polychloromethylstyrene with stilbazole; polyisoprene rubber and polyisoprene rubber treated with an acid catalyst for Friedel-Crafts reaction (such as tin chloride, aluminum chloride, etc.), etc. Examples also include 2,3,5,6-tetrachlorobenzene-1,4-dimethylol diacrylate, 2,2′-isopropylidene)-bis(2,6-dichloro-p-phenoxy)polypropyleneoxide diacrylate, products obtained by modifying unsaturated fatty acids (e.g., acrylic acid, methacrylic acid, oleic acid, sorbic acid, etc.) with glycidyl methacrylate and a diisocyanate (e.g., toluene diisocyanate), products obtained by condensing p-toluenesulfonamide with formaldehyde and mixing the resulting condensate with pentaerythritol triacrylate or trimethylolpropane triacrylate, pentaerythritol tri(or tetra)acrylate, trimethylolpropane triacrylate, pentaerythritol tetrakis($\beta$-mercaptopropionate)triacryl isocyanate, hexanediol diacrylate, N,N,N′,N′-tetrakis($\beta$-hydroxydiethyl)ethylenediamine tetraacrylate, reaction products formed between epoxy resins such as bisphenol A glycidyl ether type resins and acrylic acid, reaction products formed from unsaturated fatty acids (e.g., soybean oil fatty acid, tung oil fatty acid, linseed oil fatty acid, etc.), tripentaerythritol acrylic acid, and p-toluenesulfonic acid, and reaction products formed from epoxy resins such as bisphenol A glycidyl ether type resins, acrylic acid and N-methylol acrylamide. Furthermore, the acrylates and acrylamide derivatives of the above-described desensitizers having a hydroxyl group or amino group can also be used conveniently.

Additives which can be used in this invention are, for example, sensitizers, polymerization inhibitors and materials for general printing inks.

Examples of suitable sensitizers are carbonyl compounds such as benzoin, benzophenone, xanthone, anthraquinone, chloroanthraquinone, naphthoquinone, tetramethylaminobenzophenone, tetraethylaminobenzophenone, dimethoxybenzophenone, or dimethoxythiobenzophenone, nitro compounds such as p-nitrodiphenyl, 5-nitro-2-aminotoluene, 4-nitro-1-aminonaphthalene, dinitronaphthalene, tetranitrocarbazole, 4-nitro-1-acetylaminonaphthalene, dinitromethyl acetyl, tertiary butyl benzene, pyrylium salts such as 2-benzoylmethylene-3-ethyl-naphtho[1,2-α]thiazoline, 2,6-di(p-ethoxyphenyl)-4-(p-n-amyloxyphenyl)thiapyrylium perchloate or 2,4,6-triphenyl pyrylium perchloate, and dyes such as Methyl Violet, Victoria Blue, or Malachite Green.

These sensitizers are described in detail, for example, in U.S. Pat. Nos. 2,610,120, 2,670,285, 2,670,286, 2,670,287, 2,690,966, 2,835,656, 2,956,878, 3,023,100, 3,066,117, 3,141,770, 3,173,787, 3,575,929, 3,582,327, 3,721,566 and 3,737,319, and J. Kosar, *Light Sensitive Systems*, John Wiley and Sons, New York (1965).

The sensitizer can be appropriately employed in an amount of 0.01 to 20% by weight, preferably 0.3 to 10% by weight, based on the photosensitive component.

In order to prevent reactions in the dark, quinones, nitro compounds, sulfur compounds, and copper compounds can, for example, be used, e.g., as polymerization inhibitors. Of these, p-benzoquinone, 2,6-dichloro-p-benzoquinone, nitrosobenzene, and tertiary butyl hydroquinone are very effective. Such an additive is generally used in an amount of about 0.0001 to about 5%, preferably 0.01 to 1% by weight.

The materials used in general in printing inks are, for example, described in Chapters 2 to 9 of E. A. Apps, *Printing Ink Technology*, Leonard Hill, London, (1961). They include, for example, binders of natural or synthetic polymeric compounds such as ketone resins, polyamide resins, phenolic resins, alkyd resins, maleic acid resins, epoxy resins, melamine resins, urea resins, nitrocellulose, ethyl cellulose, butyral resins, polyvinyl alcohol, gelatin, and shellac. These polymeric compounds are generally used in an amount of 0 to 50%, preferably 3 to 20%, by weight based on the photocurable coating solution. An inorganic material as a filler such as titanium dioxide, barium sulfate, calcium carbonate, talc, kaolin, and bentonite can also be used and such is used generally in an amount of 0 to 50%, preferably 3 to 30%, by weight based on the photocurable coating solution. Additional additives also include oils such as a vegetable oil such as linseed oil, tung oil, soybean oil or cotton seed oil, which is employed in general in an amount of 0 to 50%, preferably 0 to 20% by weight, solvents such as methanol, ethanol, ethyl acetate, toluene, hexane, petroleum, methyl ethyl ketone, or methyl isobutyl ketone, which is used in general in an amount of 0 to 50%, preferably 0 to 20% by weight, and waxes such as paraffin wax, microcrystalline wax, or carnauba wax, which is generally employed in an amount of 0 to 10%, preferably 0 to 5% by weight, each based on the photocurable coating solution.

Various other additives, such as antistatic agents or coloring agents (e.g., organic and inorganic pigments), can be used as required. Furthermore, if desired, known conventional desensitizers can be used in combination in this invention.

Examples of conventional desensitizers that can be used in this invention are described in detail, for example, in U.S. Pat. No. 2,777,780, Japanese Patent Publication Nos. 27255/69, 21448/70, 22651/71 and 29546/71, Japanese Patent Application (OPI) No. 32915/72, Japanese Patent Publication Nos. 38201/72 and 4050/73, Japanese Patent Application (OPI) No. 6805/73, Japanese Patent Publication Nos. 4484/74, 8288/74, 19647/74, 23008/74, and 23850/74, Japanese Patent Application (OPI) Nos. 43708/74, 72009/74, 77709/74, 77710/74, 15513/74, and 83509/74, and German Patent Application (OLS) Nos. 2,343,800, 2,359,079, and 2,361,856. Specific examples include quaternary ammonium salts such as dodecyl trimethyl ammonium chloride and octadecyl ammonium chloride, amines having a high molecular weight such as dodecylamine and dodecyldiamine, substituted oxazolines such as 2,4,4-trimethyl-2-oxazoline, reaction products formed between diamines or polyamine derivatives containing a cyclic structure in the molecule such as xylylenediamine or N-aminopropyl piperidine and alkylene oxides, polyoxyethylene alkylamines, polyoxyethylene alkyl ethers, polyoxyethylene esters, polyoxyethylene alkylphenyl ethers, polyethylene glycol, polypropylene glycol, polyoxypropylene alkylamines, polymers containing an alkyl γ-glutamate ester group, spiro acetal-type diamines, N-(aminoalkyl)lactams, (aminoalkyl)lactams, and glycidyl ether-adducts of amines. Desensitizers containing nitrogen and a hydroxyl group is the molecule are especially useful. The amount of the desensitizer is 1 to 80% by weight, preferably 5 to 30% by weight, based on the photocurable coating solution.

The photocurable coating solution can be easily prepared by those skilled in the art by mixing and dissolving the above-described components, or by kneading the components together using, for example, a three roll mill. The photocurable coating solution can be coated on a color developer sheet using conventional printing techniques, and the coated surface is cured immediately upon irradiation with light.

The amount of the photocurable coating solution coated generally ranges from about 1 to about 15 $g/m^2$, preferably 2 to 7 $g/m^2$, on a solids basis, with the amount of the photocurable compound contained in the photocurable coating solution being about 5 to 80, preferably 20 to 60, % by weight.

Electromagnetic waves or particle rays can be suitably used as the light irradiation for the photocurable composition of this invention. For example, a photocurable composition or a recording material coated with a photocurable composition has a sensitivity in the visible to ultraviolet regions, and therefore, suitable irradiation sources are those capable of providing energy in these regions. Examples of suitable irradiation sources are a carbon arc lamp, a mercury lamp, a fluorescent lamp emitting ultraviolet light, an argon glow lamp, an electron flash lamp, a photographic flash lamp, sunlight, a xenon lamp, a low-pressure mercury lamp, a high pressure mercury lamp, a super-high pressure mercury lamp, a white light lamp, laser beams, and electron beams.

Usually the recording material is placed at a distance of about 3 cm to 100 cm from the radiation energy source, and it is irradiated in this state for about 0.0001 to about 120 seconds, preferably 0.5 to 3 seconds.

Generally, irradiation is carried out at room temperature (20° to 30° C), but can also be performed at lower temperatures, or at higher temperatures at which the recording material is not deteriorated by heat.

The area irradiated with the light is cured forming a film and thus the part is no longer tacky.

Specific examples of the color developers to which the desensitization method of this invention can be applied are clays, phenolic resins, and metal salts of aromatic carboxylic acids.

Examples of clays include, for example, acidic terra alba, activated terra alba, attapulgite, and kaolin.

Examples of phenolic resins are phenolic resins which release a proton, as is well known in the art. Specifically, examples include phenol-aldehyde polymers (novolac resins) and phenol-acetylene polymers. More specific examples include a p-phenylphenol/formaldehyde polymer, a p-fluorophenol/formaldehyde polymer, a p-chlorophenol/formaldehyde polymer, a p-bromophenol/formaldehyde polymer, a p-iodophenol/formaldehyde polymer, a p-nitrophenol/formaldehyde polymer, a p-carboxyphenol/formaldehyde polymer, an 0-carboxyphenol/formaldehyde polymer, p-carboalkoxyphenol/formaldehyde polymers, a p-aroylphenol/formaldehyde polymer, p-lower alkoxyphenol/formaldehyde polymers and copolymers formed between p-alkyl ($C_1$ to $C_{12}$) phenols (for example, p-methylphenol, p-ethylphenol, p-n-propylphenol, p-isopropylphenol, p-n-amylphenol, p-isoamylphenol, p-cyclohexylphenol, p-1,1-dimethyl-n-propylphenol, p-n-hexylphenol, p-isohexylphenol, p-1,1-dimethyl-n-butylphenol, p-1,2-dimethyl-n-butylphenol, p-n-heptylphenol, p-isobutylphenol, p-5,5-dimethyl-n-amylphenol, p-1,1-dimethyl-n-amylphenol, p-n-octylphenol, p-1,1,3,3tetramethylbutylphenol, p-isooctylphenol, p-n-nonylphenol, p-isononylphenol, p-1,1,3,3-tetramethylamylphenol, p-n-decylphenol, p-isodecylphenol, p-n-undecylphenol, p-isoundecylhenol, p-n-dodecylphenol, isomers of the above-exemplified p-alkylphenols with the alkyl moiety containing 1 to 12 carbon atoms, and mixtures of two or more of the above alkylphenols and the isomers thereof) and formaldehyde. This invention can also be appropriately applied to the p-substituted phenols exemplified above to which a substituent is also attached at the m-position.

Examples of metal salts of aromatic carboxylic acids are, for example, copper, lead, magnesium, calcium, zinc, aluminum, tin, or nickel salts of aromatic carboxylic acids.

Specific examples of the aromatic carboxylic acids are benzoic acid, chlorobenzoic acid (o-, m-, p-), nitrobenzoic acid (o-, m-, p-), toluic acid (o-, m-, p-), 4-methyl-3-nitrobenzoic acid, 2-chloro-4-nitrobenzoic acid, 2,3-dichlorobenzoic acid, 2,4-dichlorobenzoic acid, p-isopropylbenzoic acid, 2,5-dinitrobenzoic acid, p-tert-butylbenzoic acid, N-phenylanthranilic acid, 4-methyl-3-nitrobenzoic acid, salicyclic acid, m-hyroxybenzoic acid, p-hydroxybenzoic acid, 3,5-dinitrosalicyclic acid, 5-tert-butylsalicyclic acid, 3-phenylsalicyclic acid, 3-methyl-5-tert-butylsalicyclic acid, 3,5-di-tert-butylsalicylic acid, 3,5-di-tert-amylsalicyclic acid, 3-cyclohexylsalicylic acid, 5-cyclohexylsalicyclic acid, 3-methyl-5-isoamylsalicyclic acid, 5-isoamylsalicylic acid, 3,5-di-sec-butylsalicylic acid, 5-nonylsalicylic acid, 3-phenyl-5-(α,α-dimethylbenzyl)salicylic acid, 2-hydroxy-3-methylbenzoic acid, 2-hyroxy-5-tert-butylbenzoic acid, 2,4-cresotinic acid, 5,5-methylenedisalicylic acid, acetoaminobenzoic acid (o-, m-, p-), 2,4-dihyroxybenzoic acid, 2,5-dihydroxybenzoic acid, anacardic acid, 1-naphthoic acid, 2-naphthoic acid, 1-hydroxy-2-naphthoic acid, 2-hyroxy-3-naphthoic acid, 2-hydroxy-1-naphthoic acid, thiosalicylic acid, and 2-carboxybenzaldehyde. The amount of the color developer generally employed is about 0.1 g/m² to about 8 g/m², preferably 0.2 g/m² to 5 g/m². Suitable examples of color developers are described in, e.g., U.S. Pat. Nos. 3,672,935, 3,516,845, 3,455,721, 2,730,456, 2,712,507 and 2,711,375.

There is no particular limitation on the color formers which react with the color developers to which the desensitization method of this invention can be applied. Specific examples of these color formers include triarylmethane-type compounds such as 3,3-bis(p-dimethylaminophenyl)-6-dimethylaminophthalide (crystal violet lactone), 3,3-bis(p-dimethylaminophenyl)phthalide, 3-(p-dimethylaminophenyl)-3-(1,2-dimethylindol-3-yl)phthalide, 3-(p-dimethylaminophenyl)-3-(2-methylindol-3-yl)phthalide, 3-(p-dimethylaminophenyl)-3-(2-phenylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-5-dimethylaminophthalide, 3,3-bis(2-phenylindol-3-yl)-5-dimethylaminophthalide, and 3-p-dimethylaminophenyl-3-(1-methylpyrrol-2-yl)-6-dimethylaminophthalide; diphenylmethane-type compounds such as 4,4'-bis-dimethylaminobenzohydrin benzyl ether, N-halophenyl-leucoauramines, or N-2,4,5-trichlorophenyl leucoauramine; xanthene-type compounds such as rhodamine B-anilinolactam, rhodamine B p-nitroanilinolactam, rhodamine B p-chloroanilinolactam, 3-dimethylamino-7-methoxyfluorane, 3-diethylamino-7-methoxyfluorane, 3-diethylamino-6-methoxyfluorane, 3-diethylamino-7-chlorofluorane, 3-diethylamino-7-chloro-6-methylfluorane, 3-diethylamino-6,8-dimethylfluorane, 3-diethylamino-7-acetylmethylaminofluorane, 3-diethylamino-7-methylaminofluorane, 3,7-diethylaminofluorane, 3-diethylamino-7-dibenzylaminofluorane, 3-diethylamino-7-methylbenzylaminofluorane, 3-diethylamino-7-phenylamino-3-methylfluorane, 3-diethylamino-7-chloroethylmethylaminofluorane, and 3-diethylamino-7-dichloroethylaminofluorane; thiazine-type compounds such as benzoyl leuco methylene blue, and p-nitrobenzyl leuco methylene blue; spiro-type compounds such as 3-methyl-spiro-dinaphthopyran, 3-ethyl-spiro-dinaphthopyran, 3,3'-dichloro-spirodinaphthopyran, 3-benzyl-spirodinaphthopyran, 3-methylnaphtho-(3-methoxybenzo)-spiro-pyran, and 3-propyl-spiro-dibenzopyran; and mixtures of the abovedescribed compounds. Suitable examples of color formers are described in, e.g., U.S. Pat. Nos. 3,551,181, 3,514,310, 3,506,471, 3,501,331 and 3,617,335.

The color former is dissolved in a solvent and encapsulated, or dispersed in a binder solution, followed by coating on a support to form a color former layer. The amount of color former generally coated is about 0.01 g/m² to 0.4 g/m² preferably 0.05 g/m² to 0.2 g/m².

Natural or synthetic oils can be used either individually or in combination as the solvent. Examples of suitable solvents are cotton seed oil, kerosene, paraffin, naphthene oil, alkylated biphenyls, alkylated terphenyls, chlorinated paraffin, and alkylated naphthalenes.

Capsule preparation can be effected, for example, by a method utilizing the coacervation of hydrophilic colloid sols disclosed, for example, in U.S. Pat. Nos. 2,800,457 and 2,800,458, and the interfacial polymerization method disclosed, for example, in British Pat. Nos. 867,797, 950,443, 989,264 and 1,091,076.

According to another embodiment of the method of this invention, the photocurable coating solution, which may also contain additives, can be coated on the color former layer. This can be accomplished, for example, by coating the photocurable coating solution on that surface coated with microcapsules containing a color former which corresponds to the part in which color formation is not required, and then irradiating with light to cover the microcapsule-coated surface with the cured film. Thus, the microcapsule-coated surface which is covered with the cured film is difficult to destroy even with writing pressure or a printing pressure using a typewriter or the like. Should the film be broken, the color former oil inside does not flow out and move to the color developer-coated surface, and thus a color reaction does not occur. In other words, this procedure results in the physical separation of the color former from the color developer.

The effect of the desensitized printing method in accordance with the present invention was demonstrated using the following color developer sheets and color former sheets. In the following, including the examples given hereinafter, unless otherwise indicated, all parts, percents, ratios and the like are by weight.

COLOR DEVELOPER SHEET A 200 parts of active terra alba was dispersed in 800 parts of water, and the dispersion was adjusted to a pH of 10.0 with a 20% aqueous solution of sodium hydroxide. Then, 40 parts, on a solid content basis, of a styrene/butadiene copolymer latex with a styrene content of 60 mol% and 60 parts of a 10% aqueous solution of starch were added to form a color developer coating solution. The color developer coating solution was coated on a sheet of paper having a basis weight of 50 g/m² in an amount of 6 g/m², on a solid basis, using a coating rod, and then dried.

COLOR DEVELOPER SHEET B 5 parts of acidic terra alba and 1 part of aluminum oxide were added to 20 parts of water, and with stirring, a 20% aqueous solution of sodium hydroxide was added to adjust the pH of the dispersion to 10.5. Then, 6 parts of a 10% aqueous solution of gelatin was added, and furthermore, a solution of 0.56 part of zinc chloride in 8 parts of water was added gradually.

Then, a solution of 2 parts of 3,5-di-tert-butyl salicylic acid dissolved at 80° C in 20 parts of a 15% aqueous solution of sodium hydroxide was gradually added. To the resulting dispersion was added 3 parts, on a solid content basis, of a styrene/methyl methacrylate copolymer latex with a styrene content of 50 mol% thereby to form a coating solution.

The coating solution was coated on a sheet of paper having a basis weight of 50 g/m² in an amount of 4 g/m² with a coating rod, and then dried.

COLOR DEVELOPER SHEET C 170 parts of p-phenyl phenol and 70 parts of a 37% aqueous solution of formaldehyde were reacted by heating under reflux for 10 hours in the presence of 10 parts of 37% hyrochloric acid and 50 parts of water. The reaction product was cooled, and the phenolic resin was withdrawn as a powder.

40 parts of the phenolic resin obtained by the above-described method and 6 parts of a naphthalenesulfonic acid/formaldehyde condensate (average degree of polymerization: 3) together with 54 parts of water were processed in a ball mill for 1 day. Then, 100 parts of the resulting phenolic resin dispersion, 160 parts of kaolin, and 40 parts, on a solid content basis, of a methyl methacrylate/butadiene copolymer latex with a butadiene content of 50 mol% as a binder were placed in 500 parts of water, and they were thoroughly mixed with stirring to form a coating solution in accordance with the present invention. The resulting coating solution was coated on a sheet of paper with a basis weight of 50 g/m² in an amount of 5 g/m² on a solid content basis by a coating rod, and dried.

PREPARATION OF COLOR FORMER SHEET A 10 parts of acid-processed gelatin having an isoelectric point of 8.0 and 10 parts of gum arabic were dissolved in 60 parts of water at 40° C, and as an emulsifier, 0.2 part of sodium alkylbenzenesulfonate was added. Furthermore, 50 parts of a color former oil was emulsified in the mixture.

The color former oil had been prepared by dissolving 2.5% by weight of crystal violet lactone and 2.0% by weight of benzoyl leuco methylene blue in an oil comprising 4 parts of diisopropyl biphenyl and 1 part of kerosene.

When the size of the emulsified droplets became 8 μ on the average, 100 parts of water at 40° C was added to inhibit emulsification.

With continued stirring, 210 parts of water at 30° C was further added, and 20% hydrochloric acid was added to adjust the pH of the mixture to 4.4. With further stirring, the solution was cooled to 8° C, and then 1.5 parts of 20% glutaraldehyde was added.

Then, 30 parts of a 10% aqueous solution of carboxymethyl starch (degree of etherification: 0.5) was added, and a 25% aqueous solution of sodium hyroxide was added dropwise to adjust the pH to 8.5. The solution was then heated to 30° C to form microcapsules having hardened microcapsule walls. Then, 10 parts of cellulose floc (about 100 μ × 5 μ) was added to the microcapsule solution, and the resulting coating solution was coated on a sheet of paper having a basis weight of 40 g/m² in an amount of 6 g/m², on a solid content basis, and dried to form Color Former Sheet A.

PREPARATION OF COLOR FORMER SHEET B

1% by weight of crystal violet lactone, 4% by weight of 3-diethylamino-7-diethylaminofluorane, 4% by weight of 3-diethylamino-7-phenylaminofluorane, 3% by weight of 3-diethylamino-7,8-benzofluorane, 0.5% by weight of 3,6-bismethoxyfluorane and 2% by weight of benzoyl leuco methylene blue were dissolved in an oil comprising 1 part of diisopropyl naphthalene, 1 part of diisopropyl biphenyl and 2 parts of 1-(dimethylphenyl)-1-phenylethane to form a color former oil. Using 50 parts of the resulting color former oil, Color Former Sheet B was prepared in the same way as in the preparation of Color Former Sheet A.

The following Examples are given to illustrate the invention in greater detail.

EXAMPLE 1

70 parts of trimethylolpropane triacrylate, 30 parts of Hilack 111 (a trademark for a ketone resin, a product of Hitachi Kasei) and 0.05 part of p-benzoquinone were heated at 115° C, and uniformly dissolved to form a varnish having a viscosity of about 300 poises.

60 parts of the resulting varnish, 2 parts of titanium oxide, 30 parts of calcium carbonate, 10 parts of dipentaerythritol pentacrylate, 5 parts of 4,4'-dimethylaminobenzophenone and 5 parts of benzophenone were kneaded with an ordinary three-roll mill to form an ink.

The ink was fed into an offset printing press, and printed on Color Developer sheets A, B and C in a coated amount of 3.5 g/m². Each of the coated sheets was irradiated for 1 second from a distance of 5 cm with an ultraviolet irradiating apparatus including one ozoneless high pressure mercury lamp (HTQ-7 type, a product of the Phillips Company) having a reflection umbrella, an output of 2 kw and an output density of 28 w/cm.

EXAMPLE 2

566 parts of a tung oil fatty acid, 284 parts of glycidyl methacrylate (containing 100 ppm of hydroquinone monomethyl ether), 0.57 part of p-benzoquinone and 0.85 part of 2-methylimidazole were heated gradually in an atmosphere of nitrogen gas, and reacted at 110° C for 4 hours, and at 120° C for another 4 hours. Then, 556 parts of tung oil was added, and the mixture was cooled to 70° C. Subsequently, 261 parts of tolylene diisocyanate was added gradually to form a photopolymerizable polymer.

26 parts of polymerized linseed oil (viscosity: 3 poise at 25° C), 20 parts of a rosin-modified phenolic resin and 14 parts of a petroleum resin were kept at 260° C for 1 hour, and then 30 parts of light oil was added. The mixture was cooled to 150° C, and a 3% light oil solution of aluminum octylate was added to form a gel-like Varnish (A).

Separately, 38 parts of a rosin-modified phenolic resin, 35 parts of linseed oil and 18 parts of tung oil were kept at 200° C for 1 hour, and then 8 parts of light oil was added. The mixture was cooled to 85° C, and 1 part of an aluminum caprylate was added to form a gel-like Varnish (B).

10 parts of calcium carbonate, 10 parts of talc, 10 parts of barium sulfate, 50 parts of the above photopolymerizable polymer, 20 parts of Varnish (A), 10 parts of Varnish (B), 4 parts of light oil and 5 parts of benzoin methyl ether were kneaded with a three-roll mill to form a photocurable coating solution.

The coating solution was printed and cured in the same manner as in Example 1.

EXAMPLE 3

Hydroquinone monomethyl ether (0.090 part) was added to 75 parts of N,N,N',N'-tetrakis($\beta$-hydroxyethyl)ethylenediamine tetracrylate. The mixture was heated to form a solution. When the temperature of the solution became 100° C, 25 parts of Halon 80 (a trademark for a ketone resin, a product of Honshu Kagaku) was added and dissolved. The solution was immediately cooled to form a varnish 80 parts of this varnish, 20 parts of barium sulfate, 7 parts of talc, 3 parts of trimethylol propane tris($\beta$-mercaptopropionate), 5 parts of benzoin methyl ether and 2 parts of 1-naphthalenesulfonyl chloride were kneaded with a three-roll mill to form a printing ink.

The resultant ink was fed to a relief printing press, and the same procedure as in Example 1 was repeated to effect desensitization printing.

EXAMPLE 4

A 1 l three-necked flask equipped with a reflux condenser was charged with 70 parts by volume of xylene, 110 parts of tripentaerythritol and 250 parts of a linseed oil fatty acid, and while blowing nitrogen gas into the flask, the reaction was performed at 230° C under reflux of xylene.

When the acid number of the product became 15, the xylene was recovered, and the temperature was reduced. Then, 70 parts by volume of benzene, 100 parts of acrylic acid, 8 parts of p-toluenesulfonic acid and 0.5 part of hydroquinone were added, and the reaction was performed at 100° C for 15 hours under reflux of benzene while blowing air into the flask. When the acid number of the product became 25, the unreacted acrylic acid was extracted at reduced pressure to form a varnish.

50 parts of the varnish, 2 parts of zinc oxide, 25 parts of calcium carbonate and 7 parts of dimethoxybenzoquinone were kneaded with a three-roll mill to form a desensitization ink.

The desensitization ink was fed to a relief printing press, and then, the same procedure as in Example 1 was repeated to effect desensitization printing.

REFERENCE EXAMPLE 1

15 parts of a rosin-modified maleic acid resin (softening point: 120° C; acid number: 150) was added to 50 parts of polyoxyethylene stearylamine (average molecular weight: 930) as a desensitizer, and the mixture was heated at 150° C for 1 hour to form a solution. Then, 35 parts of titanium dioxide was added to the solution, and the mixture was kneaded with a three-roll mill to form a desensitization ink.

The desensitization ink was fed to a relief printing ink, and was used to print each of Color Developer Sheets A, B and C in a coated amount of 3.5 g/m$^2$.

TESTING METHOD (A) The desensitization printed area obtained in each of the above examples was placed face-to-face with each of the color former sheets. A pressure of 500 kg/cm$^2$ was applied to the assembly to form a color. The assembly was allowed to stand for one day in a dark place, and the reflection visual density value (Vis. D) was measured so as to compare the desensitization effects.

(B) The desensitization printed surface was written upon with ball-point pens and fountain pens with red, blue and black inks, and the blotting and discoloration of colored inks were compared.

The results obtained are shown in Table 1 below.

TABLE 1

| | | Desensitization Effect (Vis. D) | | | | | |
|---|---|---|---|---|---|---|---|
| | | Color Former Sheet A | | | Color Former Sheet B | | |
| Example | Drying Time | Color Developer Sheet A | Color Developer Sheet B | Color Developer Sheet C | Color Developer Sheet A | Blotting of Colored Inks | Discoloration of Colored Inks |
| 1 | within 1 sec | 0.06 | 0.06 | 0.07 | 0.08 | Good | Good |
| 2 | within 1 sec | 0.07 | 0.06 | 0.06 | 0.08 | Good | Good |
| 3 | within 1 sec | 0.05 | 0.06 | 0.05 | 0.07 | Good | Good |
| 4 | within 1 sec | 0.06 | 0.06 | 0.06 | 0.08 | Good | Good |
| Reference Example 1 | 10 min | 0.05 | 0.05 | 0.05 | 0.07 | Poor | Poor |

Note:
"Good" means that there was no blotting or discoloration; and "Poor" means that there was a large degree of blotting or discoloration.

The usefulness of the desensitization printing method of this invention is clear from the results in the above table. The effect of the desensitization printing method is greater the smaller the desensitization effect (Vis. D) value becomes. Complete desensitization is achieved with desensitization values (Vis. D) of 0.08 or below. Hence, the above results show that the desensitization printing method of this invention can lead to complete desensitization.

Further, it can be seen from the above results that while the drying time required was about 10 minutes when a conventional desensitizer was used, the method of this invention required a drying time of less than 1 second.

Moreover, on the conventional desensitization printed surface, a colored ink was discolored or blotted resulting in a marked decrease in commercial value, but according to the method of the present invention, no discoloration nor blotting occurred. When the desensitization printed surface obtained by the method of this invention was brought into contact with microcapsules containing a color former, no fog was formed.

These results demonstrate the great usefulness of the method of this invention.

EXAMPLE 5

70 parts of trimethylolpropane triacrylate, 30 parts of Hilack 111 (a trademark for a ketone resin, a product of Hitachi Kasei) and 0.05 part of p-benzoquinone were heated to 115° C, and uniformly dissolved to form a varnish having a viscosity of about 300 poises.

60 parts of the resulting varnish, 2 parts of titanium dioxide, 40 parts of calcium carbonate, 10 parts of dipentaerythritol pentacrylate, 5 parts of 4,4'-dimethylaminobenzophenone, 5 parts of benzophenone, and 10 parts of polyoxyethylene stearylamine (average molecular weight: about 980) were kneaded with an ordinary three-roll mill to form an ink.

The resulting ink was fed to an offset printing press, and each of Color Developer Sheets A, B and C were printed therewith in an amount of 3.5 g/m$^2$. The printed sheets were then irradiated from a distance of 5 cm with an ultraviolet irradiating apparatus including one ozoneless high pressure mercury lamp (HTQ-7 type, a product of Phillips Company) having a reflection umbrella, an output of 2 kw and an output density of 28 w/cm.

EXAMPLE 6

566 parts of a tung oil fatty acid, 284 parts of glycidyl methacrylate (containing 100 ppm of hydroquinone monomethyl ether), 0.57 part of p-benzoquinone and 0.85 part of 2-methylimidazole were gradually heated in an atmosphere of nitrogen gas, and the reaction was performed at 110° C for 4 hours, and at 120° C for another 4 hours. Then, 556 parts of tung oil was added, and the mixture cooled to 70° C. Subsequently, 261 parts of tolylene diisocyanate was added gradually and reacted to form a photopolymerizable polymer.

26 parts of polymerized linseed oil, 20 parts of a rosin-modified phenolic resin, and 14 parts of a petroleum resin were kept at 260° C for 1 hour, and then 30 parts of light oil was added. The mixture was cooled to 150° C, and a 3% light oil solution of aluminum octylate was added to form a gel-like Varnish (A).

38 parts of a rosin-modified phenolic resin, 35 parts of linseed oil and 18 parts of tung oil were kept at 200° C for 1 hour. Then, 8 parts of light oil was added, and the mixture was cooled to 85° C. Furthermore, 1 part of aluminum caprylate was added to form a gel-like Varnish (B).

10 parts of calcium carbonate, 10 parts of talc, 10 parts of barium sulfate, 50 parts of the above photopolymerizable polymer, 20 parts of Varnish (A), 10 parts of Varnish (B), 4 parts of light oil, 5 parts of benzoin methyl ether and 15 parts of polyoxyethylene nonyl phenyl ether (average molecular weight: 700) were kneaded with a three-roll mill to form a photocurable coating solution.

The coating solution was printed and irradiated with ultraviolet rays in the same manner as in Example 5.

EXAMPLE 7

To 75 parts of N,N,N',N'-tetrakis($\beta$-hydroxyethyl)-ethylenediamine tetracrylate was added 0.090 part of hydroquinone monomethyl ether, and the mixture was heated to form a solution. When the temperature of the solution reached 100° C, 25 parts of Halon 80 (a trademark for a ketone resin, a product of Honshu Kagaku) was added and dissolved. The solution was immediately cooled to form a photopolymerizable varnish. 80 parts of the resulting varnish, 20 parts of barium sulfate, 7 parts of talc, 3 parts of trimethylolpropane tris($\beta$-mercaptopropionate), 20 parts of a reaction product formed between xylylenediamine and propylene oxide (with an average molecular weight of about 570), 5 parts of benzoin methyl ether and 2 parts of 1-naphthalenesulfonyl chloride were kneaded with a three-roll mill to form a printing ink. The resulting ink was fed to a relief printing press, and the same procedure as in Example 5 was repeated to perform desensitization printing.

EXAMPLE 8

A 1 l three-necked flask equipped with a reflux condenser was charged with 70 parts by volume of xylene, 110 parts of pentaerythritol and 250 parts of a linseed oil fatty acid, and they were reacted at 230° C under reflux of xylene while blowing nitrogen gas into the flask. When the acid number of the reaction product reached 15, the xylene was recovered, and the temperature was reduced. Then, 70 parts by volume of benzene, 100 parts of acrylic acid, 8 parts of p-toluenesulfonic acid and 0.5 part of hydroquinone were added, and the reaction was continued at 100° C for 15 hours under reflux of benzene while blowing air into the flask. When the acid number of the reaction product reached 25, the unreacted acrylic acid was extracted under reduced pressure to form a varnish.

50 parts of the resulting varnish, 2 parts of zinc oxide, 25 parts of N-stearyl-N,N',N'-tris(2-hydroxy-3-acryloxypropyl)propylene diamine, 25 parts of calcium carbonate and 7 parts of dimethoxybenzoquinone were kneaded with a three-roll mill to form a desensitization ink.

The resulting desensitization ink was fed to a relief printing press, and the same procedure as in Example 5 was repeated to perform desensitization printing.

REFERENCE EXAMPLE 2

The procedure of Example 5 was repeated except that the polyoxyethylene stearylamine was not added.

REFERENCE EXAMPLE 3

The procedure of Example 6 was repeated except that the polyoxyethylene nonyl phenyl ether was not added.

REFERENCE EXAMPLE 4

The procedure of Example 7 was repeated except that the reaction product between xylylene diamine and propylene oxide was not added.

REFERENCE EXAMPLE 5

The procedure of Example 8 was repeated except that the N-stearyl-N,N',N'-tris(2-hydroxy-3-acryloxypropyl)propylene diamine was not added.

REFERENCE EXAMPLE 6

15 parts of a rosin-modified maleic acid resin (softening point: 120° C; acid number: 150) was added to 50 parts of polyoxyethylene stearylamine (average molecular weight: 930) as a desensitizer, and the mixture was heated at 150° C for 1 hour to form a solution. To the solution was added 35 parts of titanium dioxide, and they were kneaded by a three-roll mill to form a desensitization ink.

The resulting desensitization ink was fed to a relief printing press, and each of Color Developer Sheets A, B and C were printed therewith in an amount of 3.5 g/m².

TESTING METHOD (A) The desensitization printed area obtained in each of the above examples was placed face-to-face with each of the color former sheets, and a pressure of 500 kg/cm² was applied to the assembly to form a color. The assembly was allowed to stand for 10 days in a dark place. The desensitization effects were compared by the reflection visual density values (Vis. D).

(B) The desensitization printed surface was written upon with ball-point pens and fountain pens with red, blue and black inks, and the blotting and discoloration of colored inks were compared.

The results obtained are shown in Table 2 below.

sheets were then irradiated for about 1 second from a distance of 5 cm with an ultraviolet irradiating apparatus including one ozoneless high pressure mercury lamp (HTQ-7 type, a product of Phillips Company) having a reflecting umbrella, an output of 2 kw and an output density of 28 w/cm.

EXAMPLE 10

566 parts of a tung oil fatty acid, 284 parts of glycidyl methacrylate (containing 100 ppm of hydroquinone monomethyl ether), 0.57 part of p-benzoquinone and 0.85 part of 2-methylimidazole were gradually heated in an atmosphere of nitrogen gas, and they were reacted at 110° C for 4 hours and at 120° C for another 4 hours. Then, 556 parts of tung oil was added, and the mixture cooled to 70° C. Then, 261 parts of tolylene diisocyanate was gradually added to form a photopolymerizable compound.

Separately, 26 parts of polymerized linseed oil, 20 parts of a rosin-modified phenolic resin and 14 parts of a petroleum resin were kept at 260° C for 1 hour. Then, 30 parts of light oil was added, and the mixture was cooled to 150° C. Furthermore, a 3% light oil solution of aluminum octylate was added to form a gel-like Varnish (A).

Separately, 38 parts of a rosin-modified phenolic resin, 35 parts of linseed oil, and 18 parts of tung oil were kept at 200° C for 1 hour. Then, 8 parts of light oil was added, and the mixture was cooled to 85° C. Furthermore, 1 part of aluminum caprylate was added to form a gel-like Varnish (B).

10 parts of calcium carbonate, 10 parts of talc, 10 parts of barium sulfate, 50 parts of the above photopo-

TABLE 2

| Example (Ex.) or Reference Example (REx.) | Drying Time | Desensitization Effect (Vis. D) | | | | | | Blotting of Color Inks | Discoloration of Color Inks |
|---|---|---|---|---|---|---|---|---|---|
| | | Color Former Sheet A | | | Color Former Sheet B | | | | |
| | | Color Developer Sheet A | Color Developer Sheet B | Color Developer Sheet C | Color Developer Sheet A | Color Developer Sheet B | Color Developer Sheet C | | |
| Ex. 5 | within 1 sec | 0.05 | 0.05 | 0.05 | 0.05 | 0.05 | 0.05 | Good | Good |
| Ex. 6 | within 1 sec | 0.05 | 0.05 | 0.05 | 0.05 | 0.05 | 0.05 | Good | Good |
| Ex. 7 | within 1 sec | 0.05 | 0.05 | 0.05 | 0.05 | 0.06 | 0.05 | Good | Good |
| Ex. 8 | within 1 sec | 0.05 | 0.05 | 0.05 | 0.05 | 0.05 | 0.05 | Good | Good |
| REx. 2 | within 1 sec | 0.06 | 0.06 | 0.07 | 0.08 | 0.08 | 0.08 | Good | Good |
| REx. 3 | within 1 sec | 0.07 | 0.06 | 0.06 | 0.08 | 0.08 | 0.09 | Good | Good |
| REx. 4 | within 1 sec | 0.05 | 0.06 | 0.05 | 0.07 | 0.08 | 0.09 | Good | Good |
| REx. 5 | within 1 sec | 0.06 | 0.06 | 0.06 | 0.08 | 0.08 | 0.09 | Good | Good |
| REx. 6 | 10 min | 0.05 | 0.05 | 0.05 | 0.07 | 0.07 | 0.07 | Poor | Poor |

Note:
"Good" and "Poor" have the same meanings as used in Table 1.

EXAMPLE 9

70 parts of trimethylol propane triacrylate, 30 parts of Hilack 111 (a trademark for a ketone resin, a product of Hitachi Kasei) and 0.005 part of p-benzoquinone were heated to 115° C and uniformly dissolved to form a varnish having a viscosity of about 300 poises.

60 parts of the varnish, 2 parts of titanium dioxide, 30 parts of calcium carbonate, 10 parts of dipentaerythritol pentacrylate, 5 parts of 4,4'-dimethylaminobenzophenone and 5 parts of benzophenone were kneaded with an ordinary three-roll mill to form an ink.

The resulting ink was fed to an offset printing ink, and printed on the capsule layer surface of each of Color Former Sheets A and B in an amount of 4.5 g.m². The lymerizable polymer, 20 parts of Varnish (A), 10 parts of Varnish (B), 4 parts of light oil and 5 parts of benzoin methyl ether were kneaded with a three-roll mill to form a photocurable coating solution. The coating solution was printed, and irradiated with ultraviolet rays in the same manner as in Example 9.

EXAMPLE 11

To 75 parts of N,N,N',N'-tetrakis($\beta$-hydroxyethyl)-ethylenediamine tetracrylamide was added 0.090 part of hydroquinone monomethyl ether, and the mixture was heated to form a solution. When the temperature of the solution became 100° C, 25 parts of Halon 80 (a trademark for a ketone resin, a product of Honshu Kagaku) was added and dissolved. The solution was immediately cooled to form a photopolymerizable varnish. 80 parts of this varnish, 20 parts of precipitated barium sulfate, 7 parts of talc, 3 parts of trimethylolpropane tris($\beta$-mercaptopropionate), 5 parts of benzoin methyl ether and 2 parts of 1-naphthalenesulfonyl chloride were kneaded with a three-roll mill to form a printing ink.

The ink was fed to a relief printing press, and the same procedure as in Example 9 was repeated to perform desensitization printing.

EXAMPLE 12

A 1 l three-necked flask equipped with a reflux condenser was charged with 70 parts by volume of xylene, 110 parts of tripentaerythritol and 250 parts of a linseed oil fatty acid and they were reacted at 230° C under reflux of xylene while blowing nitrogen gas into the flask.

When the acid number of the product became 15, the xylene was recovered, and the temperature was reduced. Then, 70 parts by volume of benzene, 100 parts of acrylic acid, 8 parts of p-toluenesulfonic acid and 0.5 parts of hydroquinone were added, and the reaction was performed at 100° C for 15 hours under reflux of benzene while blowing air into the flask. When the acid number of the reaction product became 25, the unreacted acrylic acid was extracted at reduced pressure to form a varnish.

50 parts of the varnish, 2 parts of zinc oxide, 25 parts of calcium carbonate and 7 parts of dimethoxybenzoquinone were kneaded with a three-roll mill to form a desensitization ink.

The desensitization ink was fed to a relief printing press, and the same procedure as in Example 9 was repeated to perform desensitization printing.

REFERENCE EXAMPLE 7

15 parts of rosin-modified maleic acid resin (softening point: 120° C; acid number: 150) was added to 50 parts of polyoxyethylene stearylamine (average molecular weight: 930) as a desensitizer, and the mixture was heated at 150° C for 1 hour. To the resulting solution was added 35 parts of titanium dioxide, and the mixture was kneaded with a three-roll mill to form a desensitization ink.

The desensitization ink was fed to a relief printing press, and each of Color Developer Sheets A, B and C was printed therewith in an amount of 4.5 g/m$^2$.

TESTING METHOD (A) The desensitization printed surface obtained in each of the above examples was placed face-to-face with each of the color developer sheets, and a pressure of 500 kg/cm$^2$ was applied to the assembly to form a color. The assembly was placed for one day in a dark place, and the reflection visual density value (Vis. D) was measured so as to compare the desensitization effects. Furthermore, each of the color former sheets was placed face-to-face with the desensitized surface obtained in the above Reference Example 7, and the same procedure as above was repeated to determine desensitization effects.

(B) The color developer surface and the desensitization printed surface were each written upon with ball-point pens and fountain pens with red, blue and black inks, and the blotting and discoloration of the color inks were compared.

The results obtained are shown in Table 3 below.

TABLE 3

| | | Desensitization Effect (Vis. D) | | | | | | | |
|---|---|---|---|---|---|---|---|---|---|
| | | Color Former Sheet A | | | Color Former Sheet B | | | Blotting | |
| Example | Drying Time | Color Developer Sheet A | Color Developer Sheet B | Color Developer Sheet C | Color Developer Sheet A | Color Developer Sheet B | Color Developer Sheet C | of Color Inks | Discoloration of Color Inks |
| 9 | within 1 sec | 0.06 | 0.06 | 0.06 | 0.07 | 0.06 | 0.08 | Good | Good |
| 10 | within 1 sec | 0.06 | 0.06 | 0.07 | 0.07 | 0.07 | 0.08 | Good | Good |
| 11 | within 1 sec | 0.06 | 0.07 | 0.06 | 0.07 | 0.08 | 0.08 | Good | Good |
| 12 | within 1 sec | 0.06 | 0.06 | 0.06 | 0.07 | 0.06 | 0.06 | Good | Good |
| Reference Example 7 | 10 min | 0.06 | 0.06 | 0.06 | 0.07 | 0.07 | 0.07 | Poor | Poor |

Note:
In Examples 9 - 12, the blotting and discoloration were determined with regard to the color developer surface corresponding to the desensitized part. In Reference Example 7, they were determined with regard to the desensitized color developer surface. The evaluation grades have the same meaning as in Table 1.

While the invention has been described in detail and with reference to specific embodiments thereof, it will be apparent to one skilled in the art that various changes and modifications can be made therein without departing from the spirit and scope thereof.

What is claimed is:

1. A method for desensitization of a color developer sheet to form a color by reaction with a color former which comprises coating a photocurable composition on the color developer and then irradiating the coated color developer with light to cure the photocurable composition prior to color formation.

2. The method of claim 1, wherein said photocurable composition comprises a photocurable compound.

3. The method of claim 2, wherein said photocurable compound is selected from the group consisting of cinnamic acid compounds, chalcone acid compounds, stilbazole compounds and photocurable rubber compounds.

4. The method of claim 2, wherein said photocurable compound is selected from the group consisting of compounds containing vinyl or vinylidene linkages.

5. The method of claim 4, wherein said photocurable compound is a compound containing an acryl, acryloyl, acrylamide, allyl, unsaturated polyester, vinyl ester, vinyl ether, or vinyl thioether group.

6. The method of claim 2, wherein the photocurable composition contains one or more sensitizers, polymerization inhibitors, binders, fillers, oils, solvents and waxes.

7. The method of claim 6, wherein the amount of the sensitizer is about 0.01 to about 20% by weight based on the photocurable compound.

8. The method of claim 6, wherein the amount of the polymerization inhibitor is about 0.0001 to about 5% by weight based on the photocurable compound.

9. A method for desensitization of a color developer sheet which comprises preparing a photocurable composition including a photocurable compound, coating the photocurable composition on a color developer sheet, and then irradiating the coated surface with light to cure the photocurable compound prior to color formation thereby reducing or destroying the function of the color developer to form a color by reaction with a color former.

10. A method for desensitization of a color developer sheet which comprises printing a photocurable composition containing a photocurable compound on selected areas of the surface of said sheet on which said color developer is present, and then irradiating the coated surface with light to cure the photocurable compound prior to color formation thereby desensitizing the ability of the color developer to form a color on reaction with a color former in those selected areas printed.

11. A method for desensitization of selected areas of a color developer used in a pressure sensitive copying paper assembly including a layer of a color former and a layer of a color developer which causes a reaction to occur upon contact of said color former with said color developer which comprises coating a photocurable composition containing a photocurable compound on selected areas such that said layer of color former and said layer of color developer are separated by said photocurable composition and then irradiating the coated photocurable composition with light to cure the photocurable compound prior to color formation and thereby form a film between said layer of color developer and said layer of color former.

* * * * *